United States Patent [19]
Regier

[11] Patent Number: 5,841,383
[45] Date of Patent: Nov. 24, 1998

[54] CURRENT MODE TRACK AND HOLD CIRCUIT

[75] Inventor: Christopher G. Regier, Cedar Park, Tex.

[73] Assignee: National Instruments Corporation, Austin, Tex.

[21] Appl. No.: 874,064

[22] Filed: Jun. 12, 1997

[51] Int. Cl.[6] .............................. H03M 1/00; G11C 27/02
[52] U.S. Cl. .............................. 341/122; 341/141; 327/94
[58] Field of Search ................................... 327/94, 95, 96; 341/122, 141, 144

[56] References Cited

U.S. PATENT DOCUMENTS

| | | | |
|---|---|---|---|
| 5,164,616 | 11/1992 | Lewis et al. | 327/95 |
| 5,227,676 | 7/1993 | Bahr et al. | 327/94 |
| 5,418,408 | 5/1995 | Mangelsdorf et al. . | |
| 5,760,616 | 6/1998 | Vallancourt | 341/145 |

*Primary Examiner*—Howard L. Williams
*Attorney, Agent, or Firm*—Conley, Rose & Tayon; Eric A. Stephenson; Jeffrey C. Hood

[57] ABSTRACT

A current mode track and hold(T/H) circuit is provided having a high degree of accuracy. The current mode T/H circuit includes an input node, and output node, a voltage controlled current source, and a switched integretor circuit. The input node is configured to receive an input analog current signal and a feedback current provided by the voltage controlled current source. The output node is configured to receive an output analog current signal generated by the voltage controlled current source. The feedback current is equal to the output current, and both are proportional to a control voltage generated by the switched integrator circuit. The switched integrator circuit operates in either a tracking mode or a holding mode in accordance with a received binary T/H control signal. In the tracking mode, charge produced by a difference between the feedback current and the input analog current is integrated by the switched integrator circuit. Integration of charge causes a change in the control voltage generated by the switched integrator circuit. The change in control voltage, in turn, causes a change in feedback current until a steady rate is reached wherein the feedback current, and there by the output current, equals the input current. In the holding mode, the voltage controlled current source maintains the output at a constant value equal to the input current at a point in time when the switch circuit transitions from the tracking mode to the holding mode.

22 Claims, 6 Drawing Sheets

FIG. 11

CURRENT MODE TRACK AND HOLD CIRCUIT

FIELD OF THE INVENTION

The present invention generally relates to track and hold circuits, and more particularly to a track and hold circuit which samples an analog current signal.

DESCRIPTION OF THE RELATED ART

Track and hold (T/H) circuits and sample and hold circuits are widely used electronic building blocks. T/H circuits provide (1) an output which follows or tracks an input signal or (2) an output which maintains a constant or held output which represents a sampling of the input signal. These circuits are widely used in a number of applications, including signal digitization in which the input to an analog-to-digital converter (ADC) must be held constant during conversion, or in digital-to-analog converter (DAC) demultiplexing in which a single DAC generates many independent outputs.

The T/H circuit is well developed. A great variety of architectural variations and specific designs are available, implemented both monolithically and in discrete systems. In general, T/H circuits may be classified into two categories: (1) closed loop architectures which provide greater accuracies at lower speeds, and (2) open loop architectures which provide greater bandwidth but seldom provide accuracy beyond the 8-bit level.

Although T/H circuits are typically configured to handle signals in the voltage mode, current mode analog systems have advantage when seeking higher speed and greater accuracy. The improvement in accuracy is due to the fact that it is easier to design circuits with low offset current than circuits with low offset voltage.

Conventional voltage mode T/H circuits are adaptable into current mode systems, however, the adaptation is extremely cumbersome. The adaptations require current-to-voltage and voltage-to-current conversions. In systems where both high accuracy and high speed are important, these conversions can be very difficult to implement, and they add significant circuit complexity and power dissipation.

Figure 1:
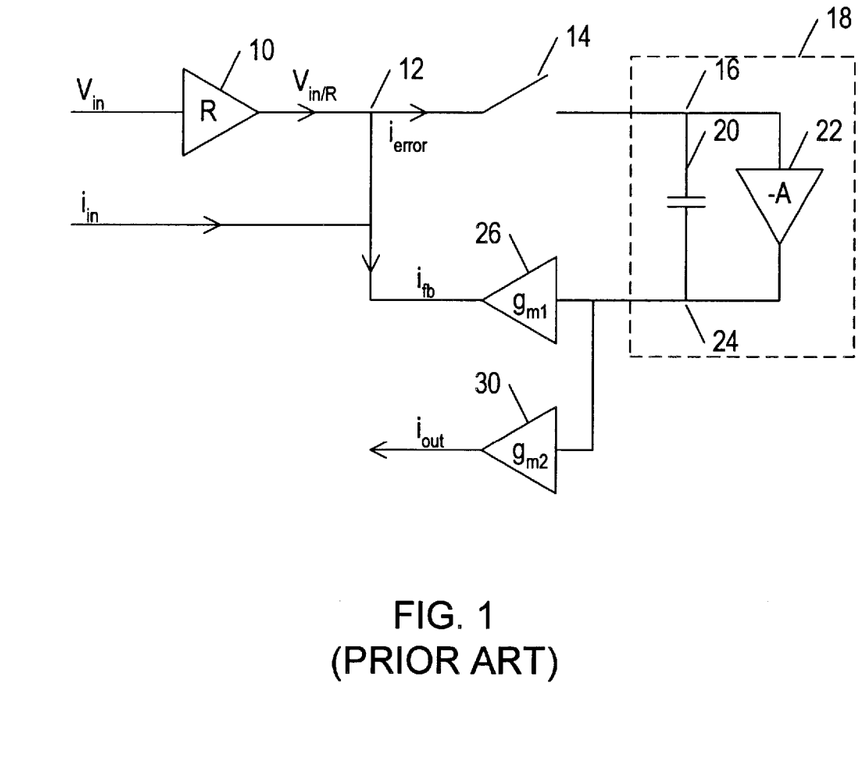
FIG. 1 is a block diagram representative of a prior art current mode T/H circuit.

FIG. 1 shows a current mode T/H circuit disclosed in U.S. Pat. No. 5,418,408, incorporated herein by reference. The T/H circuit includes an input node 12 connected between transconductance amplifier 10 and switch 14, an integrator 18 having a capacitor 20 and an operational amplifier 22, and two transconductance amplifiers 26 and 30 having transconductance values $g_{m1}$ and $g_{m2}$, respectively.

The signal to be sampled by the T/H amplifier of FIG. 1 can be either an input voltage $v_{in}$ or an input current $i_{in}$. Input current in may be applied at input node 12 or an input voltage $v_{in}$ may be applied to input of transconductance amplifier 10, which in turn provides an input current $v_{in}/R$ to input node 12. Only one of the two inputs (voltage or current) is used at a time.

Feedback current $i_{fb}$ is also supplied to input node 12 by transconductance amplifier 26. The difference between input current $i_{in}$ or $v_{in}/R$ to node 12 and feedback current $i_{fb}$ forms error current $i_{error}$, which is provided to the first terminal of switch 14.

In the sampling or tracking mode, switch 14 is in the closed position (the open, or holding position being illustrated in FIG. 1) and $i_{error}$ is provided to integrator 18. Capacitor 20 is positioned in feedback between the output and input of operational amplifier 22. Operational amplifier draws virtually no current and thus capacitor 20 accumulates all of the charge of $i_{error}$ where it becomes capacitor voltage $v_{cap}$. $v_{cap}$ is provided to first and second transconductance amplifiers 26 and 30. Transconductance amplifier 26 transforms $v_{cap}$ into feedback current $i_{fb}$. Any change in $v_{cap}$ results in a proportionate change in $i_{fb}$. Capacitor 20 continues to accumulate charge provided by $i_{error}$, and $v_{cap}$ and $i_{fb}$ continue to increase until a steady state is reached where $i_{fb}$ equals $i_{in}$.

When switch 14 is open, the T/H circuit is in hold mode and capacitor 20 holds the accumulated voltage $v_{cap}$ since there is no charge leakage. Accordingly, whatever voltage $v_{cap}$ was across capacitor 20 prior to switch 14 opening, remains fixed and drives transconductance amplifier 26 and 30 regardless of whether the input signal changes.

A significant problem associated with the prior art T/H circuit of FIG. 1 is that the accuracy of the T/H circuit is dependent upon how close $i_{fb}$ is to $i_{in}$. $v_{cap}$ drives both the feedback transconductance amplifier 26 and the output transconductance amplifier 30 to generate $i_{fb}$, and $i_{out}$. Ideally, the transconductance values $g_{m1}$ and $g_{m2}$ should be identical so that $i_{out}$ equals $i_{fb}$ which, in the steady state, equals $i_{in}$. In reality, the transconductance values $g_{m1}$ and $g_{m2}$ can not be made identical due to differences in physical geometries of devices forming the two transconductance amplifiers. As such, $i_{out}$ will not equal $i_{fb}$ or $i_{in}$ in the steady state. In other words, the differences between the transconductance values $g_{m1}$ and $g_{m2}$ ensures a gain mismatch such that $i_{out}$ never truly equals $i_{in}$, thus limiting the accuracy of this prior art T/H circuit. Furthermore, any offset voltage mismatch between transconductance amplifiers 26 and 30 will result in a offset current error in $i_{out}$.

High accuracy is very important in current mode T/H circuits particularly in DAC demultiplexing. In particular, DAC demultiplexing employs a single DAC connected to a plurality of T/H circuits via a demultiplexer. The analog current signal provided by the DAC is routed through the demultiplexer to the individual T/H circuits where it is sampled and held for output on the individual channels. DACs are often required to have excellent stability and linearity. If a plurality of T/H circuits, such as that shown in FIG. 1 are used, the gain and offset mismatches between the transconductance amplifiers 26 and 30 degrades the accuracy from channel to channel in the DAC demultiplexing system.

Figure 2:
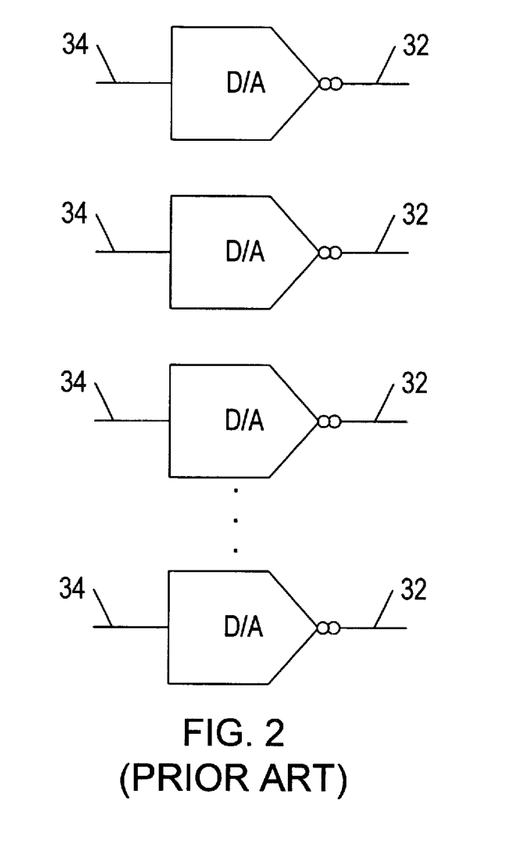
FIG. 2 is a prior art implementation shown in schematic form of a current mode DAC multi-channel system.

One solution to this problem is to remove the T/H circuits and provide a separate high resolution DAC 34 for each individual channel 32 as shown in FIG. 2. This system, however, now requires the DACs (34) to be matched, and thus only moves the problem from one part of the circuit to another. Furthermore, the complexity and expense associated with the individual DACs generally prohibits the implementation shown in FIG. 2.

Figure 3:
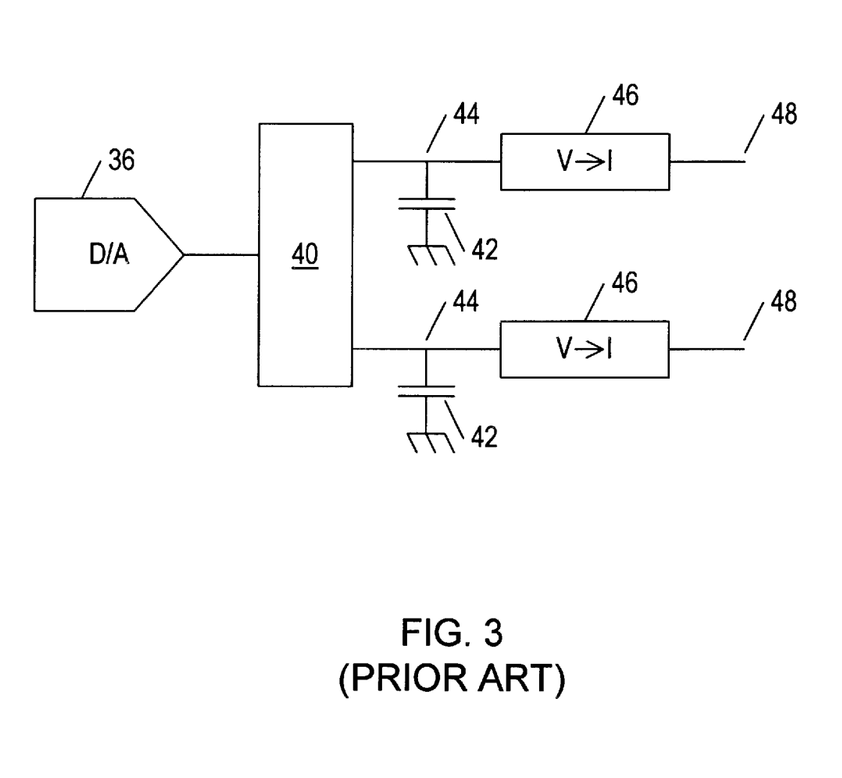
FIG. 3 is a prior art implementation shown in schematic form of a current mode DAC multi-channel system.

Another potential solution to the accuracy problem in DAC demultiplexing is shown in FIG. 3. Here, a voltage mode DAC 36 is connected to nodes 44 through demultiplexer 40. Each node 44 is connected to a capacitor 42 and voltage to current converter 46. In operation, the voltage mode DAC provides an analog output voltage which is stored across one of capacitors 42 and converted into an analog current signal by the associated converter 46. Using the system shown in FIG. 3, each channel 48 is provided with the analog current signal. However, the accuracy of the current signals provided to channels 48 are limited by the voltage-to-current converters 46 which have an internal resistor which can not be accurately matched from channel to channel. The mismatch results in a degradation of accuracy across the channels 48. There is also an offset error resulting from mismatched voltage-to-current converter offset voltages.

The present invention solves the above-identified problems and provides a current mode T/H circuit having a high degree of accuracy which can be used in a DAC demultiplexing system.

SUMMARY OF THE INVENTION

According to one aspect of the present invention, a current mode T/H circuit having a high degree of accuracy is provided. The current mode T/H circuit includes an input node, an output node, a voltage controlled current source, and a switched integrator circuit. The voltage controlled current source has three terminals including a feedback terminal connected to the input node, an output terminal connected to the output node, and a control terminal connected to the switched integrator circuit. The switched integrator circuit has three terminals including an input terminal connected to the input node, an output terminal connected to the control terminal of the voltage controlled current source, and a control terminal configured to receive a binary T/H control signal. The switched integrator circuit operates in either a tracking mode when, for example, the T/H control signal is high, or the holding mode when the T/H control signal is low.

The voltage controlled current source provides a feedback current to the input node, and an output current to the output node. The output current is equal to the feedback current and both are proportional to a control voltage provided by the switched integrator circuit. When the switched integrator circuit is in the tracking mode, any difference between the feedback current and the input current is provided to the switched integrator circuit. The difference causes a change in the control voltage generated by the switched integrator circuit. The change in control voltage causes a change in feedback current until a steady state is reached wherein the feedback current equals the input current. Since the output current of the voltage controlled current source equals the feedback current, it follows that the output current closely tracks the input current. In the holding mode, the voltage controlled current source maintains the output current at a constant value equal to the input current at a point time when the switched integrator circuit transitions from the tracking mode to the holding mode.

According to another aspect of the present invention, the switched integrator circuit includes a switch connected in series with the parallel combination of a capacitor and an operational amplifier whereby the switch is controlled in response to the T/H signal. The present invention also comprises a DAC demultiplexing system utilizing a plurality of track and hold circuits employing the present invention.

One advantage of the present invention is that it provides a current mode T/H circuit in which a single voltage controlled current source generates both the feedback current and the output current.

Another advantage of the present invention is to provide a current mode track and hold circuit whose accuracy is not controlled by the gain and offset matching of separate transconductance amplifiers.

Still another advantage of the present invention is to provide a DAC demultiplexing system having a plurality of output channels which accurately track an input.

The present invention provides other advantages as well. It is very straightforward to use the invention to generate multiple ratio-matched current sources, where the ratio of two current source outputs is a positive or negative rational number. Such ratio-matched current sources could be used in a large variety of applications, such as highly linear untrimmed digital-to-analog converters and instrumentation amplifiers with very low output offset and drift.

BRIEF DESCRIPTION OF THE DRAWINGS

Other objects and advantages of the present invention will become apparent upon reading the following detailed description and upon reference to the accompanying drawings in which.

While the invention is susceptible to various modifications and alternative forms, specific embodiments thereof are shown by way of example and the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Figure 4:
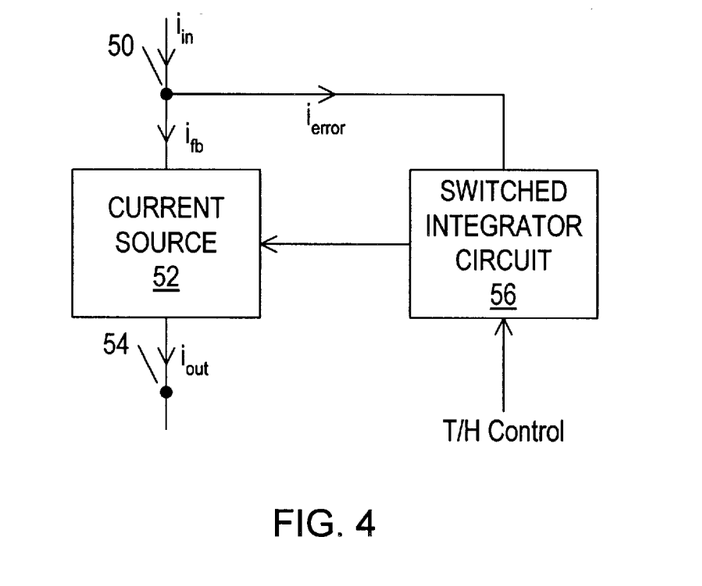
FIG. 4 is a schematic diagram of a current mode T/H circuit employing the present invention.

Referring to FIG. 4, a current mode track and hold (T/H) circuit according to the present invention is shown. The current mode T/H circuit includes a summing node 50 configured to receive input current signal $i_{in}$, a voltage controlled current source 52 which generates both feedback current $i_{fb}$ and output current $i_{out}$, an output node 54, and a switched integrator circuit 56 which controls current source 52.

Switched integrator circuit 56 is connected between the input node 50 and the voltage controlled current source 52. The switched integrator circuit 56 generates a control voltage to the current source 52 which controls the generation of $i_{fb}$ and $i_{out}$. The output current $i_{out}$ is equal to feedback current $i_{fb}$, and both are proportional to the control voltage generated by switched integrator circuit 56.

Switched integrator circuit 56 operates in two separate modes, the track mode and the hold mode, in response to a received T/H control signal. In the track mode the switched integrator circuit 56 generates a control voltage which causes the output current $i_{out}$, and thus the feedback current $i_{fb}$, to track or closely follow the input current $i_{in}$. In the track mode, the generated control voltage may vary as the input current $i_{in}$ varies. In the steady state, $i_{fb}$ equals $i_{in}$. The switched integrator circuit 56 may also operate in the hold mode wherein output current $i_{out}$ is maintained at a constant value in accordance with a constant control voltage generated by switched integrator circuit 56. The constant value of $i_{out}$ substantially equals the input current $i_{in}$ at the point in time when the switched integrator circuit switches from the tracking mode to the holding mode in response to a transition of the T/H control signal.

In contrast to prior art current mode T/H circuit shown in FIG. 1, the T/H circuit of FIG. 4 generates a feedback current $i_{fb}$ and an output current $i_{out}$ using a single current source 52. In the prior art circuit of FIG. 1, feedback current $i_{fb}$ and output current $i_{out}$ are generated using separate current sources, i.e., transconductance amplifiers 26 and 30. As was noted above, the output current $i_{out}$ in FIG. 1 accurately tracks the input current $i_{in}$ only to the extent that the transconductance values $g_{m1}$ and $g_{m2}$ can be matched. Since the T/H circuit of the present invention as shown in FIG. 4 employs a single current source, there is no need to match separate transconductance values. Accordingly, the T/H circuit of FIG. 4 is substantially more accurate than the prior art T/H circuit of FIG. 1.

Figure 5:
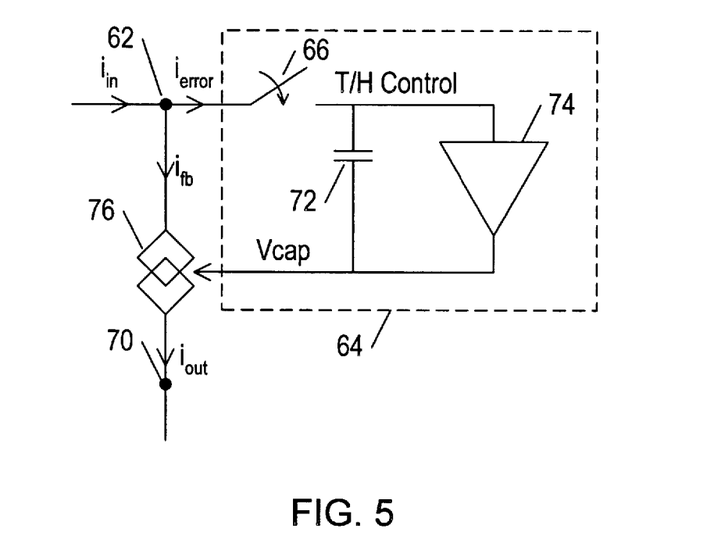
FIG. 5 is a schematic representation of a current mode T/H circuit employing the present invention.

FIG. 5 shows one implementation of the T/H circuit of FIG. 4. The T/H circuit includes an input node 62, switched integrator circuit 64, and a voltage controlled current source 76 connected to output node 70. The switched integrator circuit 64 includes switch 66 and an integrator. The integrator further includes a parallel combination of capacitor 72 and operational amplifier 74. The switched integrator circuit 64 is connected between input node 62 and the voltage controlled current source 76. The switched integrator circuit 64 generates a voltage $v_{cap}$ which controls current source 76. Output current $i_{out}$ and feedback current $i_{fb}$ are proportional to the control voltage $v_{cap}$. Switched integrator circuit 64 operates in either the tracking mode or the holding mode. In the tracking mode, switch 66 is closed in response to a T/H control signal (the open position being illustrated) which connects capacitor 72 to input node 62. With the switch 66 closed, capacitor 72 accumulates a charge provided by $i_{error}$ which equals the difference in input current $i_{in}$ and feedback current $i_{fb}$. It is possible to add a buffer (not shown) before integrator 64 so that it is not $I_{error}$ that gets integrated but a replica thereof. This could be useful for level shifting or circuit simplification in certain circumstances. As capacitor 72 charges, voltage $v_{cap}$ across capacitor 72 changes until a steady state is reached in which $i_{in}$ equals $i_{fb}$. At steady state, $i_{error}$ reduces to zero and capacitor 72 discontinues accumulating charge.

Switched integrator circuit 64 changes to the holding mode when switch 66 is opened in response to the T/H control signal transitioning from one state into another. With switch 66 open, capacitor 72 can no longer be charged. Since the input bias current of operational amplifier 74 is negligible, there can be no charge leakage off of capacitor 72. Voltage $V_{cap}$ across capacitor 72 remains constant which in turn maintains current $i_{out}$ at a constant value. In the holding mode, $i_{out}$ is unchanged by any further change in $i_{in}$ and $i_{out}$ remains constant until switch 66 is once again closed.

Figure 6:
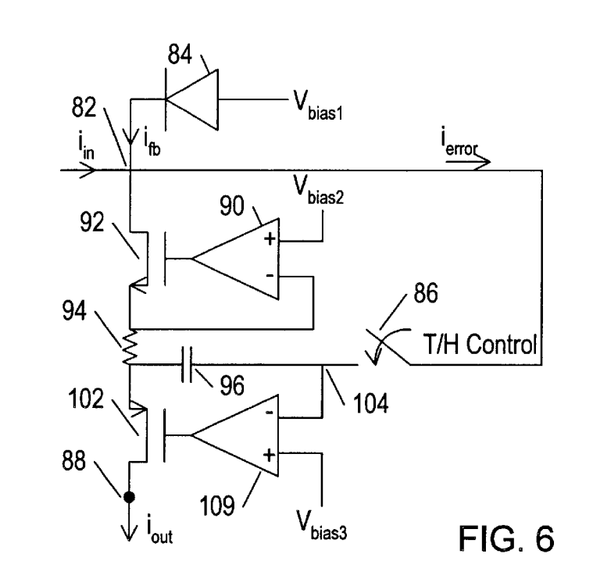
FIGS. 6–9 are schematic representations of a current mode T/H circuit according to various embodiments of the present invention.

FIGS. 6–9 show several implementations of the current mode T/H circuit of FIG. 4. FIG. 6 shows a T/H circuit having an input node 82, an output node 88, a diode 84, operational amplifier 90, transistor 92, switch 86 responsive to T/H control signal, capacitor 96, resistor 94, operational amplifier 100, and transistor 102. The diode 84 is connected between a bias voltage $v_{bias1}$ and input node 82. The operational amplifier 90 has two inputs, the first of which is connected to bias voltage $v_{bias2}$, the second of which is connected to a first terminal of resistor 94. The output of the operational amplifier 90 drives the gate input of transistor 92. Transistor 92 has a drain terminal connected to input node 82, and a source terminal connected to the first terminal of resistor 94. A second terminal of resistor 94 is connected to a source terminal of transistor 102. Switch 86 has first and second terminals which are connected together when switch 86 is closed in response to T/H control signal. The first terminal is connected to input node 82, and the second terminal is connected to capacitor 96. The second terminal of switch 86 is also connected to one of two inputs of operational amplifier 100. The second input to operational amplifier 100 is connected to bias voltage $V_{bias3}$. The output of operational amplifier 100 drives the gate of transistor 102 which has a drain terminal connected to output node 98 and a source terminal connected to resistor 94. Operational amplifier I 100 drives the gate terminal of transistor 102 so that a change in the voltage outputted by operational amplifier 100 produces a change in output current $i_{out}$.

Analog input current is provided to summing node 82. Any difference between input current $i_{in}$ and feedback current $i_{fb}$ results in error current $i_{error}$. When the T/H circuit is in tracking mode, switch 86 is closed and capacitor 96 accumulates charge provided by error current $i_{error}$. The voltage $v_{cap}$ resulting from the accumulation of charge across capacitor 96 controls feedback current $i_{fb}$ and output current $i_{out}$. Any change in $v_{cap}$ produces a proportional change in $i_{fb}$ and $i_{out}$. Because capacitor 96 is placed in a feedback loop with respect to the summing node 82, capacitor 96 will continue to accumulate charge until the feedback current $i_{fb}$ equals the input current $i_{in}$ in the steady state. Since the output current $i_{out}$ is equal to the feedback current $i_{fb}$ it follows that in the steady state $i_{out}$ closely follows or tracks input current $i_{in}$.

When switch 86 is opened, T/H circuit transitions to the holding mode. Since there is no path for charge to leak from capacitor 96, the voltage $v_{cap}$ remains constant and equal to the value it was just prior to switch 86 closing. As a result, output current $i_{out}$ is maintained at a constant value and equal to the value of input current $i_{in}$ just prior to switch 86 opening. Output current $i_{out}$ remains at this value until switch 86 again closes and the output current $i_{out}$ tracks the input current $i_{in}$. Diode 84 is off during track mode, but turns on to provide the output current during hold mode.

Figure 7:
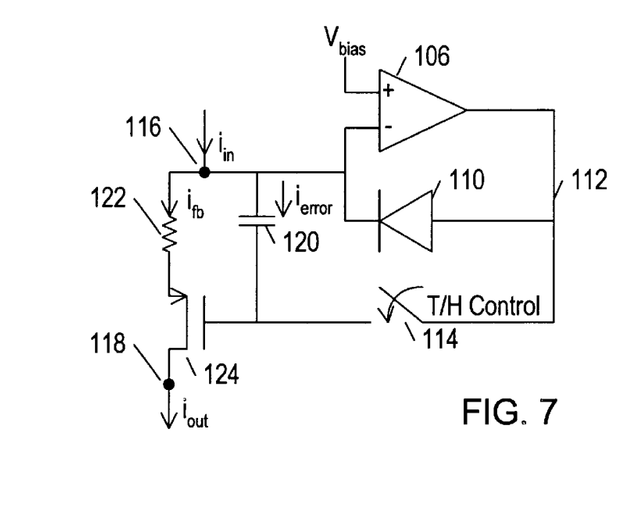

FIG. 7 shows a current mode T/H circuit which includes an input node 116, an output node 118, an operational amplifier 106, a diode 110, a switch 114 responsive to the T/H control signal, a capacitor 120, a resistor 122, and a transistor 124. Operational amplifier 106 has a pair of inputs, one of which is connected to a bias voltage $v_{bias}$. Diode 110 has a pair of terminals, including an anode which is connected to the output of operational amplifier 106, and a cathode which is connected to input node 116. Switch 114 has a pair of terminals which are connected in response to T/H control signal. The first terminal is connected to the output of operational amplifier 106, and the second terminal is connected to the gate of transistor 124. Capacitor 120 is connected between the input node 116 and the gate of transistor 124. Resistor 122 is connected between the input node 116 and the source of transistor 124. The drain of transistor 124 is connected to the output node 118.

Analog input signal $i_{in}$ is provided to summing node 116. Error current $i_{error}$ equals the difference between $i_{in}$ and $i_{fb}$. In the tracking mode, switch 114 is closed whereby capacitor 120 accumulates charge provided by $i_{error}$. Voltage $v_{cap}$ across capacitor 120 results from the accumulation of $i_{error}$ and directly controls $i_{fb}$ whereby any change in $v_{cap}$ results in a proportional change in $i_{fb}$. Capacitor 120 continues to accumulate charge until $i_{fb}$ equals $i_{in}$. Since $i_{out}$ equals $i_{fb}$, it follows that in the steady state $i_{out}$ closely tracks or follows $i_{in}$ so long as switch 114 is closed.

When switch 114 is opened, the T/H circuit transitions to the holding mode. Because there is no charge leakage path, the voltage $v_{cap}$ across capacitor 120 is maintained at a constant value which in turn maintains $i_{out}$ at a constant value. In this holding mode, the output current $i_{out}$ equals the input current $i_{in}$ just prior to the switch 114 opening. Diode 110 is off during track mode, but turns on to provide the output current during hold mode.

Figure 8:
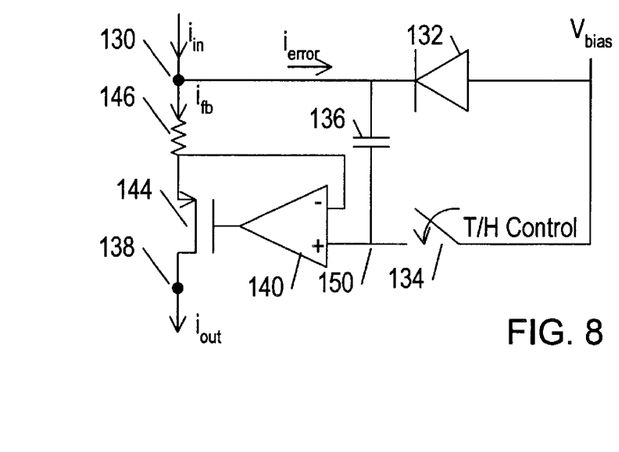

FIG. 8 shows a current mode T/H circuit which includes an input node 130, an output node 138, a diode 132, switch 134, capacitor 136, operational amplifier 140, resistor 146, and transistor 144. The diode 132 is connected between a bias voltage $v_{bias}$ and the input node 130. Switch 134 has a pair of terminals which are connected together in response to a T/H control signal. The first terminal is connected to $v_{bias}$ and the anode of diode 132, and the second terminal is connected to an input of operational amplifier 140 and a node of capacitor 136. The operational amplifier 140 has a second input which is connected to one terminal of resistor 146, and an output which drives the gate of transistor 144. Resistor 146 is connected at one terminal to the input node 130 and connected to the input of the operational amplifier 140 at a second terminal. The resistor 146 is also connected to a source terminal of transistor 144. The drain terminal of transistor 144 is connected to the output node 118. Capacitor 136 is connected between the input node 130 and the first input of operational amplifier 140.

Input current $i_{in}$ is provided to summing node 130. Any difference between input current $i_{in}$ and feedback current $i_{fb}$ results in an error current $i_{error}$. In the tracking mode, switch 134 is closed and capacitor 136 accumulates charge provided by error current $i_{error}$. Feedback current $i_{fb}$ is a function of the voltage across capacitor 136. Thus, any further accumulation of charge across 136 results in a corresponding change in the feedback current $i_{fb}$. Feedback current $i_{fb}$ continues to change with accumulation of charge across capacitor 136 until $i_{fb}$ equals $i_{in}$. Since $i_{out}$ equals $i_{fb}$ it follows that $i_{out}$ eventually closely follows or tracks the input current $i_{in}$.

When switch 134 is opened, the T/H circuit enters the holding mode. Because there is no charge leakage path, the voltage $v_{cap}$ across capacitor 136 is maintained at a constant value which in turn maintains the output current $i_{out}$ at a constant value. The constant value for $i_{out}$ equals the input current $i_{in}$ just prior to switch 134 opening. Diode 132 is off during track mode, but turns on to provide the output current during hold mode.

Figure 9:
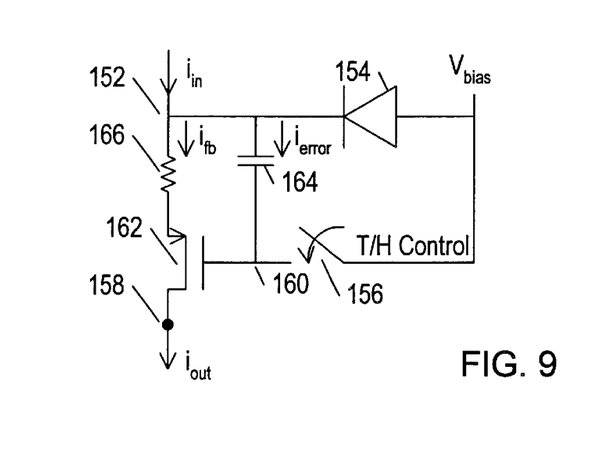

FIG. 9 shows a T/H circuit which includes an input node 152, an output node 158, diode 154, switch 156 responsive to T/H control signal, a capacitor 164, resistor 166, and transistor 162. Diode 154 is connected between a bias voltage $v_{bias}$ and the input node 152. The switch 156 has a pair of terminals which are connected together in response to a sampling signal. First terminal of switch 156 is connected to the bias voltage $v_{bias}$ and the anode of diode 154, and the second terminal of switch 156 is connected to the gate of transistor 162. Capacitor 164 is connected between the input node 162 and the gate of transistor 162. Transistor 162 has a drain terminal which is connected to the output node 158. Resistor 166 has a pair of terminals, the first of which is connected to the input node 152, the second of which is connected to the source terminal of transistor 162.

Analog input current $i_{in}$ is provided to summing node 152. Any difference between the feedback current $i_{fb}$ and input current $i_{in}$ results in error current $i_{error}$. Feedback current $i_{fb}$ is controlled by the voltage $v_{cap}$ across capacitor 164. Any change in $v_{cap}$ results in a proportional change in $i_{fb}$. When a switch 156 is closed, the T/H circuit is in tracking mode. Capacitor 164 accumulates any charge provided by $i_{error}$. The change in accumulation charge across capacitor 164 results in change in $v_{cap}$ which in turn alters the feedback current $i_{fb}$. Eventually, a steady state is reached at which $i_{fb}$ equals $i_{in}$. Since $i_{out}$ equals $i_{fb}$, it follows that $i_{out}$ closely tracks or follows input current $i_{in}$.

In the holding mode, switch 156 is opened. Since there is no charge leakage path, the voltage $v_{cap}$ across 164 remains constant which in turn maintains the output current $i_{out}$ at a constant value. The output current $i_{out}$ in the holding mode is substantially equal to the input current $i_{in}$ just prior to switch 156 opening. Diode 154 is off during track mode, but turns on to provide the output current during hold mode.

Figure 10:
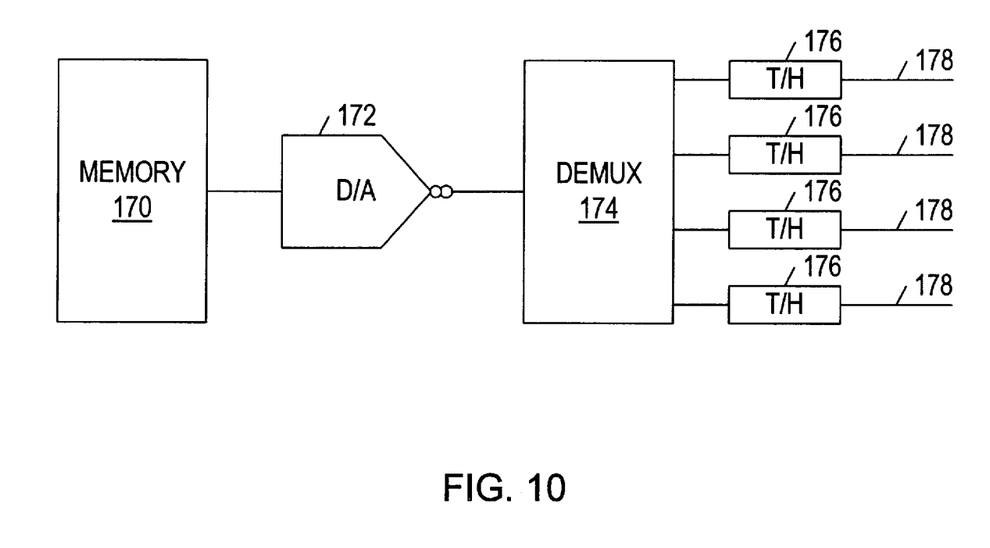
FIG. 10 is a block diagram representation of a multi-channeled current output system employing the present invention and a single current-output DAC.

FIG. 10 shows a DAC demultiplexing system employing the present invention. The system of FIG. 10 includes a memory 170, a current mode DAC 172, a demultiplexer 174, a plurality of T/H circuits 176 implementing the present invention, and a plurality of separate channels 178. Memory 170 contains addressable digital values corresponding to particular analog current signals to be provided on channels 178. The digital values are outputted by memory 170 to current mode DAC 172 which in turn generates a corresponding analog current signal. Demultiplexer 174 selectively connects the output of the current mode DAC to one of the inputs of the T/H circuits 176 in accordance with demultiplexing control signals received thereby. The T/H circuit in turn samples the analog signal output of the DAC and holds that value on its associated channel 178 in accordance with T/H control signal received thereby. The system shown in FIG. 10 is configured so that channels 78 can each produce distinct or equal analog current signals sampled with a high degree of accuracy using the T/H circuit of the present invention. With the implementation of FIG. 10 a single high accuracy DAC can be used to generate high accuracy currents across each of the plurality of channels 178. Additionally, the configuration shown in FIG. 10 requires only a single calibration since the system shown in FIG. 10 employs only a single DAC, and the demultiplexer 174 and T/H circuits 176 are inherently accurate.

Figure 11:
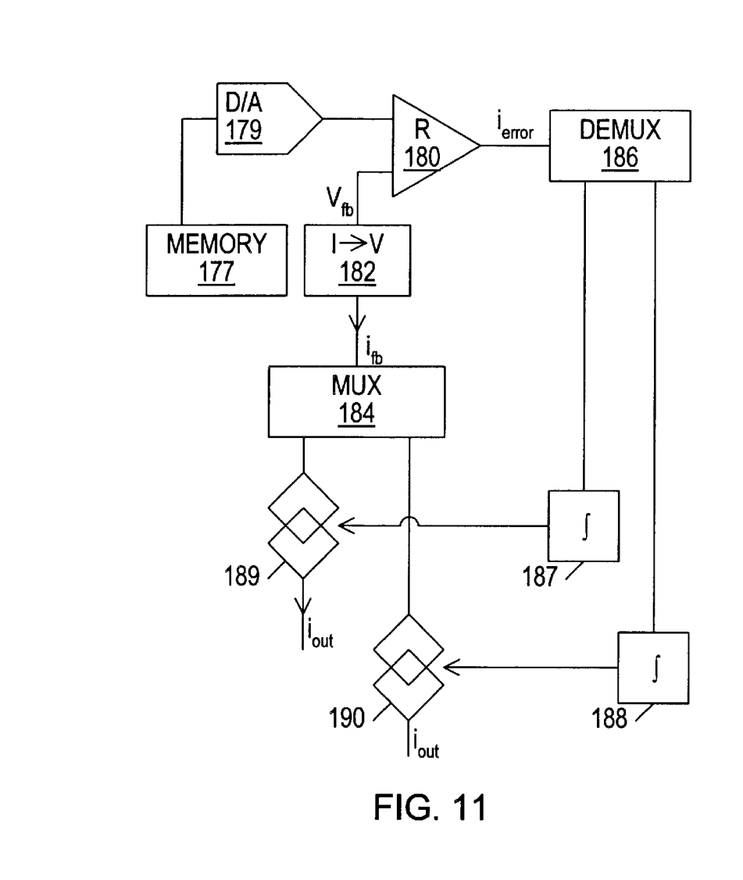
FIG. 11 is a block diagram representation of a multi-channeled current output system employing the present invention and a single voltage-output DAC.

FIG. 11 shows an alternative demultiplexing system employing the present invention. The demultiplexing system includes memory 177 connected to voltage-out DAC 179, a transconductance amplifier 180, a current-to-voltage converter 182, multiplexer 184, demultiplexer 186, integrators 187 and 188, and voltage controlled current sources 189 and 190 connected at their output nodes to separate channels. FIG. 11 shows a demultiplexing system implemented in the voltage mode, it being understood that the demultiplexing system may be implemented in the current mode by replacing the transconductance amplifier 180 and current to voltage converter with a current summing node, and the voltage-out DAC 179 with a current-out DAC.

The transconductance amplifier 180 has a pair of inputs one of which is connected to an analog voltage input $v_{in}$ provided by DAC 179, the other of which is connected to the output of current to voltage converter 182. The transconductance amplifier converts a voltage difference between its inputs into a current $i_{error}$. The output of the transconductance amplifier is connected to demultiplexer 186. Integrators 187 and 188 are connected to the outputs of demultiplexer 186 whereby integrators 187 and 188 are selectively connected to the output of transconductance amplifier 180 whereby one of the integrators integrates $i_{error}$. Voltage outputs of integrators 187 and 188 are connected to control terminals of voltage controlled current sources 189 and 190, respectively. Multiplexer 184 has an output connected to the current-to-voltage converter 182, and a pair of inputs connected to voltage controlled current sources 189 and 190, whereby the voltage controlled current sources 189 and 190 are selectively connected to the voltage-to-current converter in response to the selection signal received by multiplexer 184. It is to be noted that essentially the same selection signal drives both multiplexer 184 and demultiplexer 186.

Operation of the system shown in FIG. 11 will be made with respect to multiplexer 184 and demultiplexer 186 receiving a signal which connects (1) voltage controlled current source 189 to current-to-voltage converter 182, and (2) integrator 187 connected to transconductance amplifier 180, it being understood that operation of the system in FIG. 11 is substantially similar when multiplexer 184 and demultiplexer 186 connect (1) voltage controlled current source 190 to current-to-voltage converter 182, and (2) integrator 188 to transconductance amplifier 180. Integrator 187 generates a control voltage which controls the feedback current $i_{fb}$ and output current $i_{out}$ generated by voltage controlled current source 189. Output current $i_{out}$ equals feedback current $i_{fb}$, and any change in the voltage generated by the integrator 187 produces a proportion of change in $i_{out}$ and $i_{fb}$. Current-to-voltage converter 182 converts feedback current $i_{fb}$ into an analog voltage equivalent $v_{fb}$. Transconductance amplifier 180 converts any difference between the input voltage signal $v_{in}$ and $v_{fb}$ into an error current $i_{error}$. Integrator 187 produces its control voltage in response to an accumulation of charge provided by error current $i_{error}$. Thus, the control voltage outputted by the integrator 187 fluctuates with any change in $i_{error}$. With integrator 187 positioned in a feedback relation to transconductance amplifier 180, control voltage generated by 187 will continue to change until, in the steady state, feedback voltage $v_{fb}$ equals input voltage $v_{in}$. In the steady state, the output current $i_{out}$ provided to one of the multiplexer channels, is a current mode equivalent of the input voltage $v_{in}$.

When multiplexer 184 and demultiplexer 186 transition, the output current $i_{out}$ is maintained at a constant level since integrator 187 is disconnected from transconductance amplifier 180. The accuracy of the output current $i_{out}$ is enhanced there being no requirement to match transconductance values as required in the prior art. The transconductance amplifier 180 and voltage-to-current converter 182 are commonly used between the integrator and voltage controlled current source pairs. This ensures channel-to-channel matching in the demultiplexer system shown.

Figure 12:
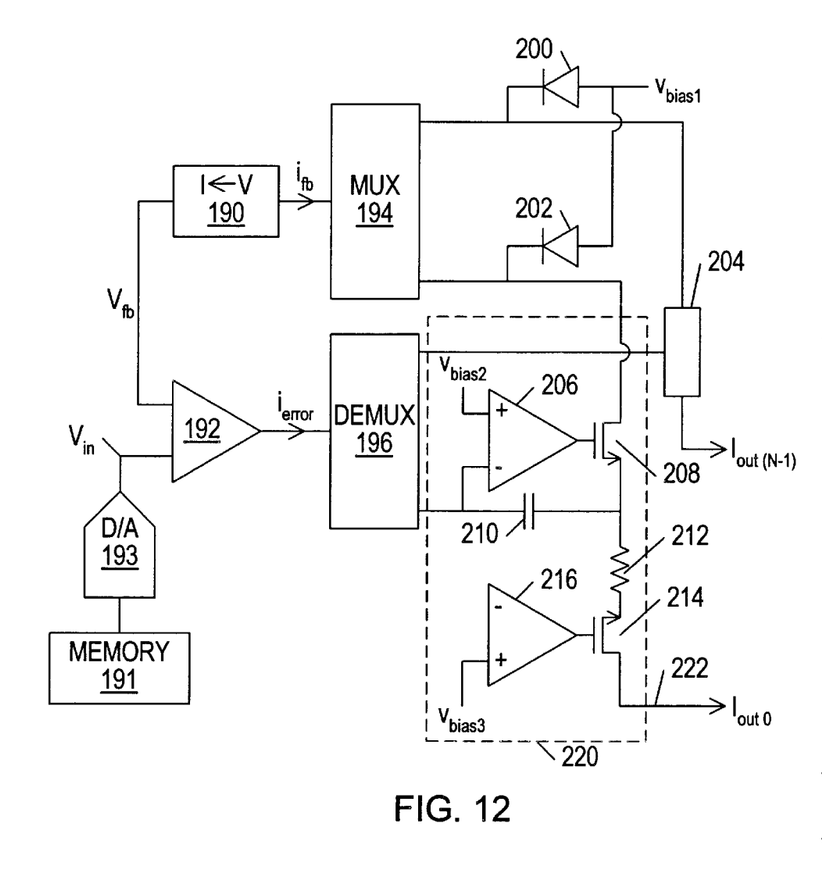
FIG. 12 is a schematic representation of a multi-channeled current output system employing the present invention and a single voltage-output DAC.

FIG. 12 shows one implementation of the demultiplexing system shown in FIG. 11. FIG. 12 includes memory 191 connected to a voltage out DAC 193, a transconductance amplifier 192 having one input connected to an input voltage $v_{in}$ provided by DAC 193 and a second input connected to the output voltage of current-to-voltage converter 190. Current-to-voltage converter 190 converts feedback current $i_{fb}$ into a feedback voltage $v_{fb}$. Any difference between the input voltage $v_{in}$ and the feedback voltage $v_{fb}$ is converted into an error current $i_{error}$. Demultiplexer 196 selectively connects error current $i_{error}$ to one of two outputs in response to a selection signal received thereby. Multiplexer 194 selectively connects the current-to-voltage converter 190 to one of the two multiplexer inputs in response to essentially the same selection signal which controls demultiplexer 196. Diode 202 is connected between one input of multiplexer 194 and voltage $v_{bias1}$. The paired integrators/voltage controlled current sources are defined by elements 204 and 220. Further explanation of the integrator/voltage controlled current source pairs will be made with respect to element 220, it being understood that element 204 contains identical circuitry and operates in substantially the same manner. Element 220 includes an operational amplifier 206 having a first input connected to $v_{bias2}$ and a second input connected to an output of demultiplexer 196. The operational amplifier 206 drives a gate terminal of transistor 208. Transistor 208 has a drain terminal connected to an input of multiplexer 194 and a source terminal connected to resistor 212 and capacitor 210. Capacitor 210 is connected to one output of demultiplexer 196 and one input of operational amplifier 206. Resistor 212 has one terminal connected to one input of operational amplifier 216 and to a source terminal of transistor 214. Operational amplifier 216 has a second input connected to bias voltage $v_{bias3}$. The operational amplifier 216 drives the gate terminal of transistor 214. Additionally, transistor 214 has drain terminal connected to channel 222.

Voltage $v_{cap}$ across capacitor 210 develops from an accumulation of charge provided by error current $i_{error}$. Capacitor voltage $v_{cap}$ controls the output current $i_{out}$ and thus feedback current $i_{fb}$ so that any change in voltage of $v_{cap}$ produces a proportional change in output current $i_{out}$ and feedback current $i_{fb}$. Capacitor 210 continues to accumulate charge and voltage $v_{cap}$ continues to change so long as there is a non-zero error current $i_{error}$. The error current $i_{error}$ is produced so long as there is a difference between the input voltage $v_{in}$ and the feedback voltage $v_{fb}$. Eventually, the voltage of $v_{cap}$ achieves a steady state level where $v_{fb}$ equals $v_{in}$ and $i_{error}$ reduces to zero. In this steady state, the output current $i_{out}$ is a current domain equivalent of the input voltage $v_{in}$. When the demultiplexer 196 and multiplexer 194 transition, the integrator/voltage controlled current source defined by element 220 is disconnected from the transconductance amplifier 192 and at current-to-voltage converter 190, whereby the output current $i_{out}$ on line 222 maintains a constant value, the current being supplied by diode 202. Further, when the multiplexer 194 and demultiplexer 196 transition, the integrator/voltage controlled current source represented by element 204, is connected to the transconductance amplifier 192 and current-to-voltage converter 190. The accuracy of the output currents is enhanced when compared to the prior art since there is no requirement to match transconductance values. The transconductance amplifier 192 and current to voltage converter 190 are commonly used. This ensures channel to channel matching.

In any track and hold circuit, it is desirable to reduce the amount of charge that is injected from the switch to the hold capacitor. This is because any switch charge which is stored on the capacitor translates directly into hold mode signal error in the form of either a voltage error in the case of a voltage mode track and hold circuit or a current error in the case of a current mode track and hold circuit. The charge injected from the switch may also generate a noise spike when returning to the track mode from the hold mode. Several methods may be used to reduce the charge injection to the hold capacitor in the present invention. For example, before the switch is closed, an additional switch temporarily connects one side of the integration switch to a voltage equal to the nominal voltage on the other side of the integration switch. This precharges any stray capacitance on that node. If this is not done, charge stored on the node would couple directly into the circuit when the switch was closed, thereby increasing charge injection noise.

In circuits with multiple switches such as shown in FIGS. 11 and 12, charge injection to the hold capacitor could be reduced by adjusting the timing of switch closures to reduce or eliminate the possibility of a race condition. For example, in FIG. 11, if a switch in multiplexer 184 opens before the corresponding switch in demultiplexer 186, then the circuit is running in an open loop while still in the track mode, a situation that could cause large errors. Thus, in practice, demultiplexer 186 is opened (placing the channel in hold mode) before multiplexer 184 is opened, and multiplexer 184 is closed to select the next channel before demultiplexer 186 is closed for the next channel. For a given channel, the following timing could be utilized. First, data is written to DAC 179 from memory 177 and multiplexer 184 is closed. A delay period would follow to allow voltages to settle. Thereafter, the precharging switch is closed for the $I_{error}$ signal. Again a predetermined delay occurs to allow voltages to settle before the precharging switch is opened. Then, the appropriate demultiplexer 186 switch is closed and the current is tracked for a desired time. The appropriate switch of demultiplexer 186 is opened followed by the opening of the appropriate switch of multiplexer 184 in order to move on to the next channel.

It is also possible to reduce charge injection related errors by adjusting the supply voltage. This is a standard charge injection reduction procedure whereby the supply voltage is chosen for the switches and/or multiplexers to minimize charge injection at the signal voltages chosen. Switches and circuits such as that shown in FIG. 6 operate at a constant signal voltage level ($V_{bias3}$), thus lending themselves well to this procedure and also to precharging.

Having thus described the basic concept of the invention, the basic block diagram implementation and multiple embodiments, it will be readily apparent to those skilled in the art that the foregoing detailed disclosure is intended to be presented by way of example only, and is not limiting.

Various alterations, improvements, and modifications will occur and are intended to those skilled in the art, though not expressly stated herein. These modifications, alterations and improvements are intended to be suggested hereby, and are within the spirit and scope of the invention. Accordingly, the invention is limited only by the following claims and equivalence thereto:

I claim:

1. A current mode track and hold (T/H) circuit for sampling an input current signal and providing an output current signal comprising:
    an input node configured to receive an input current signal;
    an output node configured to transmit an output current signal;
    a switched integrator having an input coupled to the input node wherein the switched integrator is configured to produce a control signal, and;
    a current source connected between the input and output nodes, wherein the current source includes an input receiving the control signal output by the integrator, whereby current flowing between the input and output nodes is controlled by the control signal of the switched integrator, wherein the control signal causes the output current signal to substantially track the input current signal.

2. A current mode track and hold (T/H) circuit for sampling an input current signal and providing an output current signal, comprising:
    an input node configured to receive an input current signal;
    an output node configured to transmit an output current signal;
    a switch having first and second terminals wherein the first terminal is connected to the input node wherein the switch is operable between open and closed positions, wherein the switch is closed and the first and second terminals are connected together in response to a sampling signal;
    an integrator having an input coupled to the second terminal of the switch wherein the integrator is configured to produce a control signal and;
    a voltage controlled current source connected between the input and output nodes, wherein the voltage controlled current source includes an input receiving the control voltage output by the integrator whereby current flowing between the input and output nodes is controlled by the control voltage of the integrator, wherein the control voltage causes the output current signal to substantially track the input current signal.

3. The current mode T/H circuit of claim 2 wherein the integrator further includes capacitor connected between the second terminal of the switch and a control voltage input terminal of the voltage controlled current source, wherein the capacitor accumulates charge when the first and second terminals are connected.

4. The current mode T/H circuit of claim 2 wherein the integrator output voltage is generated as a function of an integration of charge having flowed through the switch when the first and second terminals thereof are connected together.

5. The current mode T/H circuit of claim 2 wherein the voltage controlled current source further comprises:
    a diode connected between a first bias voltage and the input node;
    a first transistor having a gate and two terminals a first one of which is connected to the input node;
    a first amplifier having an output connected to the gate of the first transistor, a first input connected to a second bias voltage and a second input connected to a second terminal of the first transistor;
    a resistor having a first terminal connected to the second terminal of the first transistor, and a second terminal;
    a capacitor connected between the second terminal of the switch and the second terminal of the resistor;
    a second transistor having a gate and a pair of terminals, a first terminal of which is connected to the second terminal of the resistor, a second terminal of which is connected to the output node;
    a second amplifier having an output connected to the gate of the second transistor, a first input connected to the second terminal of the switch, and a second input connected to a third bias voltage.

6. A current mode T/H circuit comprising:
    an input node configured to receive an input current signal;
    an output node configured to transmit an output current signal;

an amplifier having a first input connected to the input node, a second input connected to a bias voltage, and an output;

a diode connected between the first input of the amplifier and the output of the amplifier;

a switch having a first terminal connected to the output of the amplifier and a second terminal, wherein the first and second terminals are connected together in response to a sampling signal;

a capacitor connected between the input node and the second terminal of the switch;

a resistor having a first terminal connected to the input node and a second terminal, and;

a transistor having a gate connected to the second terminal of the switch, a first terminal connected to the second terminal of the resistor, and a second terminal connected to the output node.

7. A current mode T/H circuit comprising:

an input node configured to receive an input current signal;

an output node configured to transmit an output current signal;

a diode connected between the input node and a bias voltage;

a resistor having a first terminal connected to the input node and a second terminal;

a switch having a first terminal connected to the bias voltage and a second terminal, wherein the first and second terminals are connected together in response to a sampling signal;

an amplifier having a first input connected to the second terminal of the switch, a second input connected to the second terminal of the resistor, and an output;

a capacitor connected between the input node and the second terminal of the switch, and;

a transistor having a gate connected to the output of the amplifier, a first terminal connected to the second terminal of the resistor, and a second terminal connected to the output node.

8. A current mode T/H circuit comprising:

an input node configured to receive an input current signal;

an output node configured to transmit an output current signal;

a diode connected between the input node and a bias voltage;

a switch having a first terminal connected to the bias voltage and a second terminal wherein the first and second terminals are connected together in response to a sampling signal;

a capacitor connected between the input node and the second terminal of the switch;

a resistor having a first terminal connected to the input node, and;

a transistor having a gate connected to the second terminal of the switch, a first terminal connected to the second terminal to the resistor, and a second terminal connected to the output node.

9. A digital to analog converting system comprising:

a digital to analog converter having an input configured to receive a digital signal, and an output configured for transmitting an analog current signal representation of the received digital signal;

a demultiplexer having an input connected to the output of the digital to analog converter, and at least two outputs, wherein the demultiplexer selectively connects the demultiplexer input to one of the demultiplexer outputs in response to a selection signal;

at least two T/H circuits, each of which comprises;

an input node connected to a respective output of the demultiplexer for receiving the analog current signal therefrom;

an output node configured to present an output analog current signal which is substantially equal to the received analog current signal;

a switch having first and second terminals which are connected together in response to a sampling signal, the first terminal being connected to the input node;

an integrator having an input connected to the second terminal of the switch and an output voltage, and;

a voltage controlled current source connected between the input and output nodes, whereby current flowing between the input and output nodes is controlled by the output voltage of the integrator.

10. The digital to analog converting system of claim 9 further comprising an addressable memory configured to contain digital values representative of discrete current signals, the addressable memory having an output connected to the input of the digital to analog converter.

11. The digital to analog converter system of claim 9 wherein the integrator further includes a capacitor connected between the second terminal of the switch and a control voltage input terminal of the voltage controlled current source.

12. The digital to analog converter system of claim 11 wherein the capacitor accumulates charge when the first and second terminals are connected.

13. The digital to analog converter system of claim 12 wherein the integrator output voltage is generated as a function of an integration of charge having flowed through the switch when the first and second terminals thereof are connected together.

14. The digital to analog converter system of claim 13 wherein the voltage controlled current source has an input terminal connected to the output voltage of the integrator.

15. The digital to analog converter system of claim 14 wherein the voltage controlled current source further comprises:

a diode connected between a first bias voltage and the input node;

a first transistor having a gate and two terminals a first one of which is connected to the input node;

a first amplifier having an output connected to the gate of the first transistor, a first input connected to a bias voltage and a second input connected to a second terminal of the first transistor;

a resistor having a first terminal connected to the second terminal of the first transistor, and a second terminal;

a capacitor connected between the second terminal of the switch and the second terminal of the resistor;

a second transistor having a gate and a pair of terminals, a first terminal of which is connected to the second terminal of the resistor, a second terminal of which is connected to the output node;

a second amplifier having an output connected to the gate of the second transistor, a first input connected to the second terminal of the switch, and a second input connected to a third bias voltage.

16. A current mode T/H circuit comprising:

an input node configured to receive an input current;

an output node configured to transmit an output current;

a voltage controlled current source having three terminals including a feedback terminal connected to the input node, an output terminal connected to the output node, and a control voltage terminal configured to receive a control voltage wherein the voltage controlled current source generates the output and feedback currents as a function of the control voltage, and;

a switched integrator circuit having an input terminal connected to the input node and an output terminal connected to the control voltage terminal, wherein the switched integrator circuit is configured to generate a hold control voltage and a tracking control voltage, wherein the output current of the voltage controlled current source tracks the input current when in response to the tracking control voltage, and the output current of the voltage controlled current source is constant in response to the hold control voltage.

17. The current mode T/H circuit of claim 16 wherein the voltage controlled current source further comprises:

a resistor having a first terminal connected to the input node and a second terminal, and;

a transistor having a gate connected to the control voltage terminal, a first terminal connected to the second terminal of the resistor, and a second terminal connected to the output node.

18. The current mode T/H circuit of claim 16 wherein the switched integrator circuit further comprises:

a diode connected between a bias voltage and the input node;

a switch having first and second terminals connected together in response to a sampling signal, the first terminal being connected to the bias voltage, and;

a capacitor connected between the input node and the second terminal of the switch.

19. The current mode T/H circuit of claim 18 wherein the second terminal of the switch is connected to the output terminal of the switched integrator circuit.

20. The current mode T/H circuit of claim 17 wherein the voltage-controlled current source further comprises an operational amplifier having an input connected to the output terminal of the switched integrator circuit, a second input terminal connected to the second terminal of the resistor, and an output connected to the gate of the transistor.

21. The current mode T/H circuit of claim 16 wherein the switched integrator further comprises:

an operational amplifier having a first input connected to the input node, a second input connected to a bias voltage, and an output;

a diode connected between the output of the operational amplifier and the input node;

a switch having first and second terminals connected together in response to a sampling signal, the first terminal being connected to the output of the operational amplifier, and the second terminal being connected to the output terminal of the switched integrator circuit, and;

a capacitor connected between the input node and the output node of the switched integrator circuit.

22. A multiple channel T/H circuit comprising:

an input node for receiving an analog input voltage;

a plurality of output nodes each configured to transmit an analog output current;

a transconductance amplifier for generating an analog current as a function of the analog input voltage, the transconductance amplifier having a first input connected to the input node, a second input, and an output;

a current to voltage converter having an output connected to the second input of the transconductance amplifier, and an input;

a multiplexer having an output connected to the input of the current to voltage converter, and at least two inputs, wherein the multiplexer connects one its inputs to its output in response to a multiplexer signal;

at least two voltage controlled current sources each having a feedback terminal connected to an input terminal of the multiplexer, and an output terminal connected to one of the output nodes, and a control voltage terminal connected to receive a control voltage wherein each voltage controlled current source generates an analog output current as a function of the control voltage inputted thereto;

a demultiplexer having an input connected to the output of the transconductance amplifier, and at least two outputs, wherein the demultiplexer is configured to demultiplex the analog current generated by the transconductance amplifier to one of the demultiplexer's outputs in response to a demultiplexer signal, and;

at least two integrator circuits each having an input terminal connected to one of the demultiplexer's outputs, and an output terminal connected to a control voltage terminal of one of the voltage controlled current sources, wherein each integrator circuit is configured to generate a hold control voltage or a tracking controlled voltage, wherein the analog output current of each voltage controlled current source tracks the multiplexed current in response to the tracking control voltage, and the analog output current of the voltage controlled current source is constant in response to the hold control voltage.

* * * * *